(12) United States Patent
Greene et al.

(10) Patent No.: US 7,919,977 B2
(45) Date of Patent: Apr. 5, 2011

(54) CIRCUITS AND METHODS FOR TESTING FPGA ROUTING SWITCHES

(75) Inventors: Jonathan W. Greene, Palo Alto, CA (US); John McCollum, Saratoga, CA (US); Volker Hecht, Barsinghausen (DE)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/860,004

(22) Filed: Aug. 20, 2010

(65) Prior Publication Data

US 2010/0315118 A1    Dec. 16, 2010

Related U.S. Application Data

(62) Division of application No. 12/205,656, filed on Sep. 5, 2008, now Pat. No. 7,804,321.

(51) Int. Cl.
*H03K 19/00* (2006.01)
*H01L 25/00* (2006.01)
(52) U.S. Cl. .............. 326/16; 326/41; 326/47
(58) Field of Classification Search ............ 326/16, 326/38–41, 47, 49; 327/408
See application file for complete search history.

(56) References Cited

U.S. PATENT DOCUMENTS 6,949,951 B1 * 9/2005 Young et al. ........... 326/37
7,471,104 B1 * 12/2008 Chirania ............... 326/38

* cited by examiner

*Primary Examiner* — Daniel D Chang
(74) *Attorney, Agent, or Firm* — Lewis and Roca LLP (57) ABSTRACT

An FPGA architecture includes multiplexers having non-volatile switches having control gates coupled to word lines W, each word line associated with a row, the switches connecting to wiring tracks through buffers having a controllable ground connection NGND, at least some of the switches being a tie-off switch coupleable to one of a plurality of bitlines B, each bitline associated with column.

12 Claims, 7 Drawing Sheets

CIRCUITS AND METHODS FOR TESTING FPGA ROUTING SWITCHES

CROSS-REFERENCE TO RELATED APPLICATIONS

This application is a divisional of co-pending U.S. patent application Ser. No. 12/205,656, filed Sep. 5, 2008, the entirety of which is incorporated by reference herein.

BACKGROUND OF THE INVENTION

1. Field of the Invention

The present invention relates to field-programmable gate arrays (FPGAs). More particularly, the present invention relates to testing for manufacturing defects in FPGA devices.

2. The Prior Art

Testing the routing tracks and switches in an FGPA device for manufacturing defects is an important part of the FPGA manufacturing process. Such defects manifest themselves in ways that may be described by fault models. Testing should be done with the best possible coverage of potential faults and the least possible test time.

Reprogrammable FPGA routing is typically tested by programming various configurations into the FPGA device and then executing test patterns for each configuration. To reduce test time, the number of configurations and the number of test patterns required for each configuration should be minimized. A test pattern is a set of specific data applied to and expected from a design which has been configured in the device.

Reprogrammable non-volatile FPGAs have generally been tested like other reprogrammable FGPAs. However non-volatile FPGAs may require more time to program each configuration than an SRAM-based FPGA. For instance, this is often true of flash-based FGPAs. It would therefore be especially advantageous for reprogrammable non-volatile FPGAs if a way can be found to achieve good coverage with fewer configurations, even if some extra circuitry or more test patterns are required.

Figure 1:
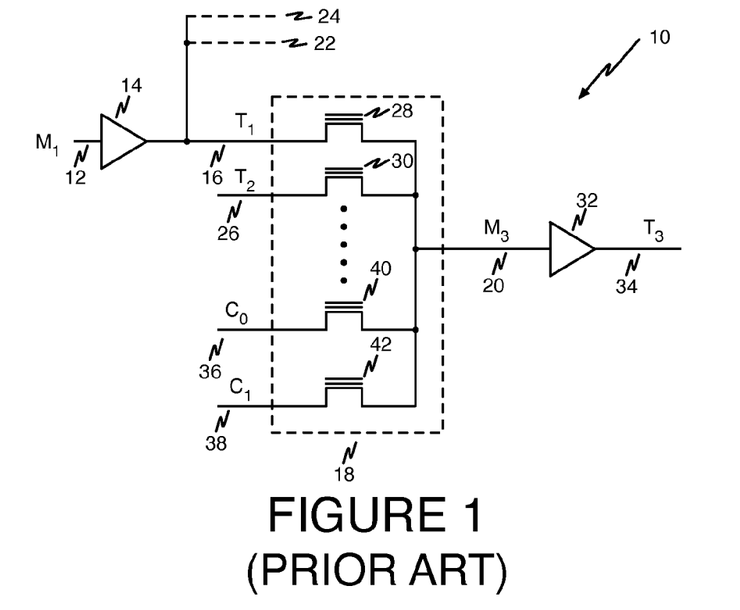
FIG. 1 is a schematic diagram showing a typical portion of a reprogrammable routing network.

FIG. 1 is a schematic diagram showing a typical portion of a reprogrammable routing network 10. A signal $M_1$ on line 12 is buffered by buffer 14 to drive routing track 16 with a signal $T_1$. In particular, FIG. 1 shows this signal drives a routing multiplexer 18 whose output is $M_3$ on line 20. The signal $T_1$ fans out to drive inputs of one or more routing multiplexers via lines 22 and 24. Routing multiplexer 18 receives input from other tracks, such as $T_2$ on line 26 and selects which of signals $T_1$ and $T_2$ to output by turning on one of non-volatile transistor switches 28 or 30. The signal $M_3$ on line 20 is buffered by buffer 32 to drive signal $T_3$ on routing track 34.

The multiplexer may also be driven to a constant logic 0 (signal $C_0$ on line 36), or to a constant logic 1 (signal $C_1$ on line 38). The non-volatile transistor switches used for this purpose (shown at reference numerals 40 and 42) are referred to as tie-off switches. In some cases either the $C_0$ or $C_1$ tie-off switch may be omitted depending on the logical purpose of the particular routing multiplexer in question. In any event, one or the other is required to put the routing buffer in a fixed state when it is not needed.

Persons of ordinary skill in the art will appreciate that in FIG. 1 the switches are drawn as floating gate transistor switches 28, 30, 40 and 42, but they could also be implemented as other types of non-volatile switches, or as volatile switches such as ordinary NMOS or CMOS pass gates controlled by control bits stored in SRAM configuration memory. The use of such other non-volatile switches is specifically contemplated as being within the scope of the present invention.

For purposes of the present invention, FPGA faults may generally be classified into several categories. A list of these categories is provided in the following Table 1:

TABLE 1

| No. | Description | Type |
|---|---|---|
| 1 | Mux output ($M_i$) or track ($T_i$) stuck at 0 | functional |
| 2 | Mux output ($M_i$) or track ($T_i$) stuck at 1 | functional |
| 3 | Mux output shorted to corresponding track ($M_i$ to $T_i$) | functional |
| 4 | Routing switch stuck closed | functional |
| 5 | Two or more tracks shorted ($T_i$ to $T_j$, $i \ne j$) | functional |
| 6 | Two or more mux outputs shorted ($M_i$ to $M_j$, $i \ne j$) | functional |
| 7 | Mux output shorted to non-corresponding track ($M_i$ to $T_j$, $i \ne j$) | functional |
| 8 | Tie-off switch stuck closed | functional |
| 9 | Switch stuck open | functional |
| 10 | Track open between buffer and switch | functional |
| 11 | Open circuit between $C_0$ or $C_1$ and the tie-off switches | functional |
| 12 | High-resistance switch | delay |
| 13 | High-resistance track | delay |

Fault types 1 and 2 are "stuck bit" faults. Fault type 1 is where the output $M_i$ of the routing multiplexer or the signal $T_i$ on the input track to the routing multiplexer is stuck at a logic "0" state. Fault type 2 is where the output $M_i$ of the routing multiplexer or the signal $T_i$ on the input track to the routing multiplexer is stuck at a logic "1" state.

Fault type 3 is where the output $M_i$ of the routing multiplexer is shorted to the signal $T_i$, the track driven by the output of the same routing multiplexer. Fault type 4 is where one of the routing non-volatile memory transistor switches (either 28 or 30 in FIG. 1) is stuck in the on position.

Fault type 5 is where two or more tracks, i.e., $T_i$ and $T_j$ (where $i \ne j$) are shorted together. Fault type 6 is where the outputs of two or more multiplexers are shorted together.

Fault type 7 is where the output $M_i$ of one routing multiplexer is shorted to a signal $T_j$ that is normally driven by the output of another routing multiplexer. Fault type 8 is where one of the tie-off transistors (40 and 42 in FIG. 1) is stuck closed.

Fault type 9 is where one of the non-volatile memory switches is stuck open. Fault type 10 is where a track between one of the buffers and non-volatile memory switches is open. Fault type 11 is where there is an open circuit between one of the tie-off signals ($C_0$ and $C_1$ in FIG. 1) and an associated tie-off switch.

Fault type 12 is where the on resistance of one of the non-volatile memory transistor switches is high. Fault type 13 is where the resistance of one of the tracks is high.

Fault types 1 through 11 are referred to as functional faults because they represent physical device failures or wiring defects and the chip functions incorrectly at any speed. Fault types 12 and 13 are referred to as delay faults because the chip will still function correctly if sufficient time for signal propagation is allowed.

With a type 3 fault, the corresponding routing buffer has its input and output shorted. This would most likely manifest itself as a type 1 or 2 fault. However the type 3 fault is listed separately to make clear that all cases of shorts between multiplexer outputs and tracks have been enumerated.

Since each routing switch connects some $M_i$ to some $T_j$, a type 4 fault is also a type 7 fault. However the type 4 fault is listed separately to make clear that all cases of switch faults have been enumerated.

A type 8 fault might result in a type 1 or type 2 fault if the constant input dominates any other signal connected to the multiplexer output. But this is not necessarily the case (e.g., the constant input is a logic "1" and another input can still sink the multiplexer output to ground).

A small set of a few test configurations is generally sufficient to permit each track to be controlled (i.e., driven to 0 and to 1), and each track to be observed, at least indirectly. By indirectly, it is meant that a track is considered controllable if it is driven by some other track that is controllable. A track is considered observable if it drives some other track that is observable. Such a set of test configurations covers all faults of types 1 through 3 (as well as some faults of other types).

A somewhat larger set of test configurations is generally sufficient to guarantee that for each pair of tracks $T_i$ and $T_j$, i≠j, there exists a configuration in which both tracks are independently controllable and $T_i$ is observable, and there exists a configuration (possibly but not necessarily the same configuration) in which both tracks are independently controllable and $T_j$ is observable. This provides the ability to reliably detect shorts between the two tracks. Since $T_i$ is driven by and $T_j$ is driven by $M_j$, this also provides the ability to reliably detect shorts between $M_i$ and $M_j$, between $M_i$ and $T_j$, and between $M_j$ and $T_i$. Thus such a set of test configurations covers all faults of types 4 through 7, as well as types 1 through 3. Most likely the set would need to contain only about a half-dozen configurations for a typical state of the art FPGA architecture. The exact number is architecture dependent.

Faults of type 8 through 11 can also be covered by a sufficiently large set of configurations. However this set would be much larger than those previously discussed, perhaps requiring two dozen or more configurations, although the exact number is architecture dependent. Also covering faults of type 12 and 13 (the delay faults) would significantly increase the number of configurations required. It would be useful if it could be made easier to cover faults of type 8 through 13.

A primary objective is to detect the existence of any fault with the fewest configurations, not necessarily to identify the location of a fault. The latter is useful, but more configurations can be used for fault location since it is not done during production testing.

BRIEF DESCRIPTION OF THE INVENTION

The present invention allows thorough coverage of faults in an FPGA routing network without needing to program a large number of test configurations into the FPGA.

According to a few aspects of the present invention, pullup transistors are provided to pull selected tracks up to $V_{DD}$. Selected buffers may be disabled by coupling their ground connections to a signal that may be raised to turn them off. Selected inputs of multiplexers are coupled to bitlines through select transistors.

According to other aspects of the present invention tests are disclosed for performing fault analysis of certain FPGA circuits and conductors.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Throughout the following disclosure, various terms will be used. Some of these terms and their meanings are summarized here:

i: index identifying a routing multiplexer and its corresponding buffer and routing track;

x: index identifying a column of switches;

y: index identifying a row of switches;

$W_y$: word (horizontal) line; connects to control gates of flash devices in a row;

$B_x$: bit (vertical) line; connects to a sense amp corresponding to column x of the switch array;

$T_i$: routing track; conveys signal from a routing buffer to inputs of various routing multiplexers;

$M_i$: routing multiplexer output; conveys output of routing multiplexer to input of corresponding routing buffer, which in turn drives track $T_i$;

$C_0$, $C_1$: global signals equivalent to logic 0 and logic 1, respectively;

$C_{0x}$, $C_{1x}$: signals connected to one or more tie-off switches in column x (during normal operation these are equivalent to logic 0 or logic 1, respectively; for testing, they are connected to bit line $B_x$);

NGND: a signal that is low during normal operation and high during testing;

TSTEN: a signal that is high to enable testing and low during normal operation.

Previously-discussed FIG. 1 is the starting point for an understanding of the present invention. It is assumed that the switches comprising the multiplexers are laid out in an array of rows and columns.

In order to test the switches, the ability is needed to force a logic value on the tracks $T_i$, and to observe the logic state of the multiplexer outputs $M_j$, preferably without adding any extra capacitance to the nodes $M_j$ during normal operation as this would increase signal propagation delay.

To force the tracks, a new global signal NGND is added. NGND is grounded during normal operation, but high during testing. The routing buffers are enhanced so that their output is forced high when NGND is raised to logic 1.

Figure 2:
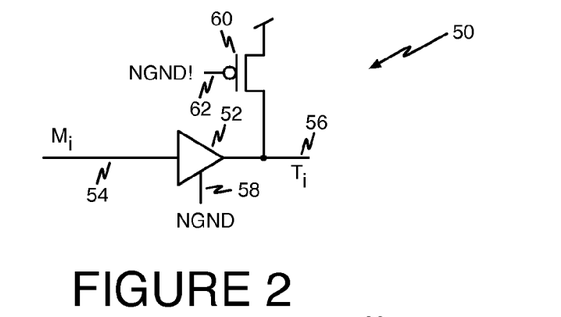
FIG. 2 is a diagram showing one illustrative way to implement enhanced routing buffers according to one aspect of the present invention.

Referring now to FIG. 2, a circuit diagram shows one illustrative way to implement enhanced routing buffers according to one aspect of the present invention. Enhanced routing buffer 50 includes buffer 52 having an input line 54 carrying signal $M_i$, and an output line 56 carrying signal $T_i$. Line 58 carrying the control signal NGND is used as the ground supply for the buffer 52. In addition, a p-channel pullup transistor 60 is connected to the output line 56 and is gated by the complement of NGND, denoted NGND! on line 62.

Persons skilled in the art will observe that using a switched NGND signal to power the buffers 52 also facilitates support for a low-power mode during which the buffers are switched off. Such skilled persons will also recognize that there are other ways to force the output of buffer 52 to a high state under control of a signal like NGND that will work equally well. When the switches are implemented using certain non-volatile technologies, such as flash memory devices, it may also be necessary to drive all tracks high during programming operations. The NGND signal can also serve this purpose.

To observe the multiplexer outputs without adding extra capacitance to them, use is made of the tie-off switches 40 or 42 of FIG. 1. Instead of always connecting the tie-off switches to logic 0 or logic 1, provision is made to allow them to be connected to an observation circuit via a bit line, as is now shown with reference to FIGS. 3A through 3C.

Figure 3A:
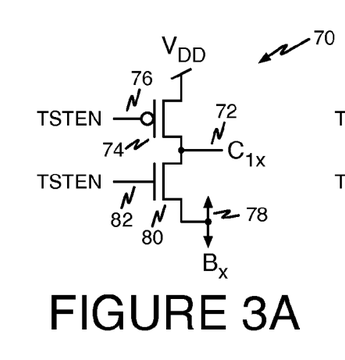
FIGS. 3A through 3C are schematic diagrams showing illustrative ways of connecting tie-off switches to an observation circuit via a bit line, according to another aspect of the present invention.

As shown in circuit 70 of FIG. 3A, the $C_{1x}$ tie-off signal on line 72 can be either tied to $V_{DD}$ by turning on transistor 76 by de-asserting the signal TSTEN on its gate line 76 or connected to the bit line $B_x$ at reference numeral 78 by turning on transistor 80 by asserting the signal TSTEN on its gate line 82.

Figures 3B, 3C:
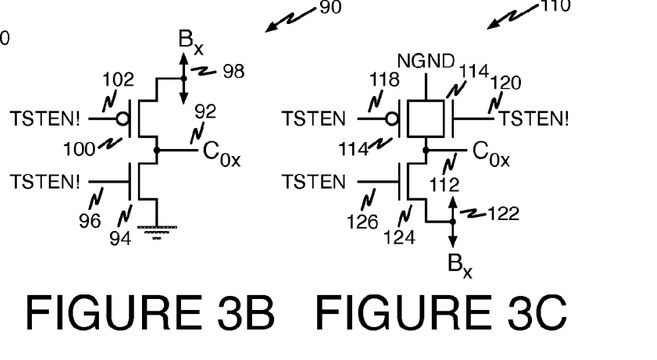

As shown in circuit 90 of FIG. 3B, the $C_{0x}$ tie-off signal on line 92 can be either tied to ground by turning on transistor 94 by de-asserting the signal TSTEN to raise gate line 96, or connected to the bit line $B_x$ on line 98 by turning on transistor 100 by asserting the signal TSTEN to lower gate line 102. TSTEN is a global signal that is asserted (raised) for those tests employing the bit lines.

Some non-volatile switch technologies may require that the source or drain of each switch be kept high during programming. In this case, NGND (which is high during programming) is used instead of ground as the global logic 0 signal, C0. In this situation, the circuit 110 shown in FIG. 3C is used instead of the circuit shown in FIG. 3B. In circuit 110 of FIG. 3C, the $C_{0x}$ tie-off signal on line 112 can be either tied to the signal NGND by turning on p-channel transistor 114 and n-channel transistor 116 (acting together as a transmission gate) by de-asserting the signal TSTEN on the gate line 118 of p-channel transistor 114 and its complement signal TSTEN! on the gate line 120 of n-channel transistor 116, or to the bit line $B_x$ on line 122 by turning on transistor 124 by asserting the signal TSTEN on its gate line 126.

TSTEN is a global signal that is raised for those tests employing the bit lines. In the circuits 70 and 110 of FIGS. 3A and 3B, raising TSTEN to a logic 1 state turns on the n-channel transistors (80, 94 and 124) to connect to the bit line $B_x$, and lowering TSTEN to a logic 0 state turns on the p-channel transistor 74, the n-channel transistor 94, and the transmission gate transistors 114 and 116 to connect $V_{DD}$, ground, and NGND, respectively.

The following discussion assumes a tie-off switch located at column x of the switch array. If this switch is used to drive the multiplexer low and this is the only tie-off switch in the multiplexer, then a signal $C_{0x}$, specific to column x, is used instead of $C_0$. If this switch is used to drive the multiplexer high and this is the only tie-off switch in the multiplexer, then a signal $C_{1x}$, specific to column x, is used instead of $C_1$. If the multiplexer has tie-off switches for both constants $C_0$ and $C_1$, either $C_0$ is replaced by $C_{0x}$, or $C_1$ is replaced by $C_{1x}$, but not both.

By placing the observation point before the tie-off switch, adding capacitive loading to the signal propagation path through the routing multiplexer is avoided. However the appropriate tie-off switch must be turned on when using the bit line to observe a multiplexer output.

Figure 4:
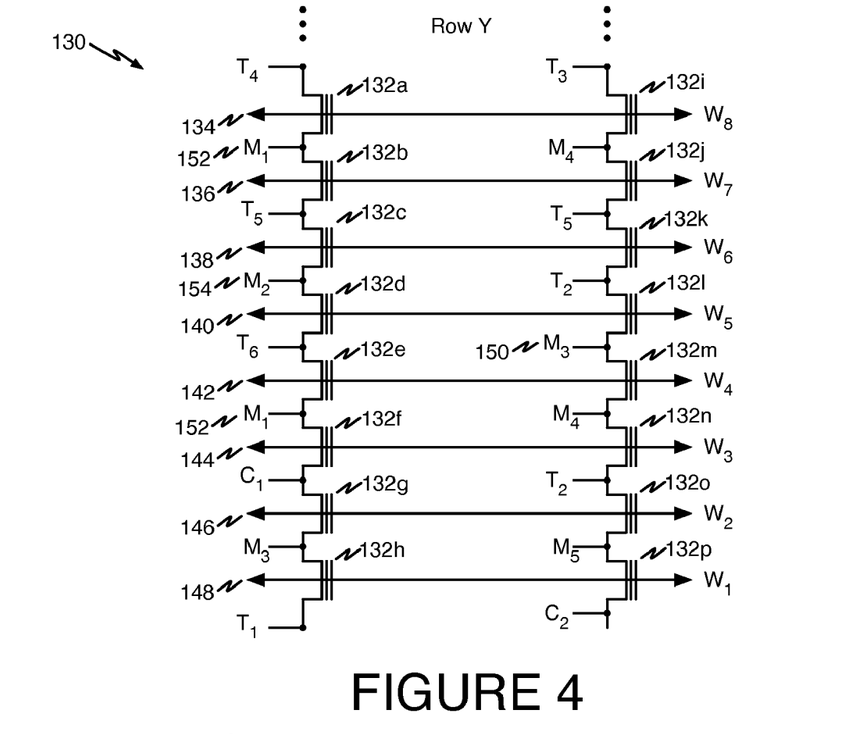
FIG. 4 is a diagram showing an illustrative example of a portion of the layout of an array of programmable floating gate switches according to another aspect of the present invention.

Referring now to FIG. 4, a diagram shows an illustrative example of a portion 130 of the layout of an array of programmable floating gate switches 132a through 132p. All switches in the same row y share a control gate or word line $W_y$. FIG. 4 illustrates a portion of an array with eight word lines $W_1$ through $W_8$, shown at reference numerals 134, 136, 138, 140, 142, 144, 146, and 148, respectively. Persons skilled in the art will observe that, other than the word line, the means for programming the floating gates are omitted from FIG. 4.

Typically all of the switches comprising a specific multiplexer will be located in the same column, but this is not necessarily the case (e.g., the multiplexer whose output is $M_3$ at reference numeral 150 in FIG. 4). The switches comprising various multiplexers may be interspersed (e.g., those comprising the multiplexers whose outputs are $M_1$ and $M_2$ at reference numerals 152 and 154, respectively, in FIG. 4).

In some cases it may be that a switch connects two distinct multiplexer outputs (e.g., switch 132m connecting $M_3$ and $M_4$ in FIG. 4) or two distinct tracks (e.g., switch 132k connecting tracks $T_2$ and $T_5$ in the figure), and thus may not make a useful connection. Such switches are referred to as isolation switches and will always be configured in a non-conducting state during normal operation. A stuck-closed fault in isolation switches is equivalent to a short between two multiplexer outputs or two tracks, and is thus a type 5 or type 6 fault.

During normal FPGA operation, the switches either conduct or do not according to how they were configured during programming. However for purposes of performing testing using the bit lines according to the present invention, it is assumed that the transistor switches may also be controlled dynamically by means of the word lines without reprogramming. This is accomplished by first programming (or erasing) all switches so they are in some common state. Then, a sufficiently high voltage $V_{on}$ is applied to $W_y$, and all the switches in row y will be forced to conduct. Alternatively, by applying a sufficiently low voltage $V_{off}$ to $W_y$, all the switches in row y will be forced to not conduct. By applying these voltages to the word lines, the switches can be dynamically controlled. Persons skilled in the art will realize that such dynamic control of the switches will not have the same addressing flexibility that exists when programming them individually in the usual way.

The states of key signals and the switches in the various modes are summarized in TABLE 2.

TABLE 2

| Mode | NGND | TSTEN | C0x | C1x | Switches |
| --- | --- | --- | --- | --- | --- |
| Normal Operation | low | low | low | high | In configured state |
| Test Using Bit Lines | high | high | floating | floating | Under control of word lines |
| Programming | high | low | high | high | Being programmed |

Figure 5:
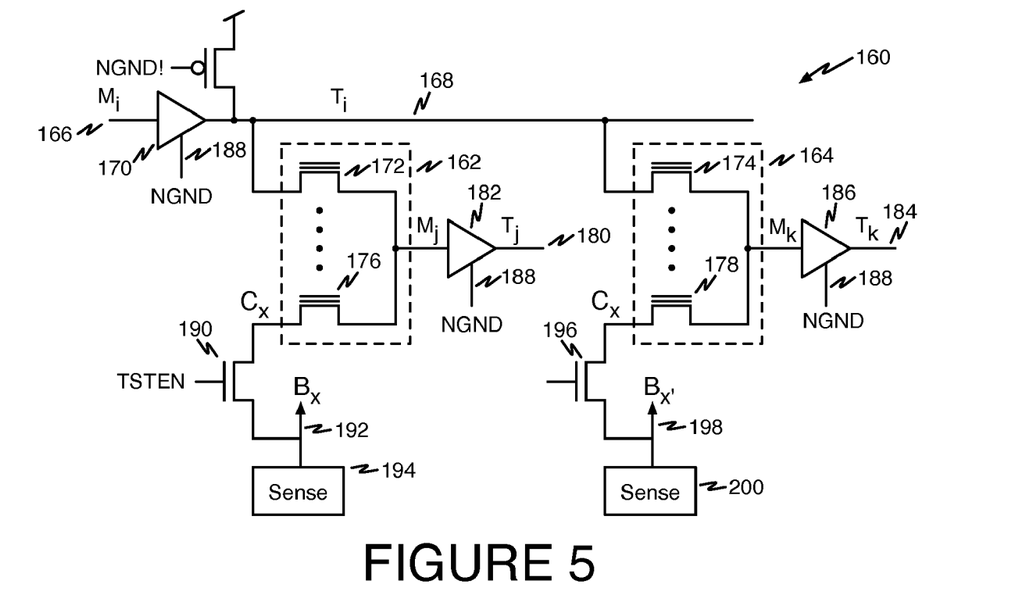
FIG. 5 is a diagram showing a typical test path according to another aspect of the present invention.

Referring now to FIG. 5, a diagram shows a typical test path through a portion 160 of an FPGA architecture in accordance with one aspect of the present invention. Portion 160 of the FPGA architecture illustrated in FIG. 5 includes multiplexers 162 and 164. Routing multiplexer output $M_i$ (shown at reference numeral 166) drives track $T_i$ (reference numeral 168) through buffer 170. Track Ti drives switch 172 in multiplexer 162 as well as switch 174 in multiplexer 164. The constant $C_x$ drives switch 176 in multiplexer 162 and switch 178 in multiplexer 162. The output of multiplexer 162 $M_j$ drives track $T_j$ (at reference numeral 180) through buffer 182 and the output of multiplexer 164 drives track $T_k$ (at reference numeral 184) through buffer 186. Buffers 170, 182 and 186 are controlled by the NGND signal at reference numeral 188 as previously disclosed.

Transistor 190 couples the $C_x$ input of multiplexer 162 to bitline $B_x$ shown at reference numeral 192. The state of bitline $B_x$ may be read by sense amplifier 194. Similarly, transistor 196 couples the $C_x$ input of multiplexer 164 to bitline $B_{x'}$ shown at reference numeral 198. The state of bitline $B_x$ may be read by sense amplifier 200.

Persons of ordinary skill in the art will note that it is possible for multiple parallel test paths driven by the same track to be active simultaneously. For example, a test path from track $T_i$ through multiplexer 162 to its output $M_i$ sensed on bitline $B_x$ at reference numeral 192 through switch 176 and transistor 190 may be active at the same time as a test path from track $T_i$ through multiplexer 164 to its output $M_i$ sensed on bitline $B_x$ at reference numeral 198 through switch 178 and transistor 196. This may even be unavoidable if a track fans out to multiplexers of a symmetrical nature occurring in multiple switch columns but addressed by the same switch rows.

Figure 6:
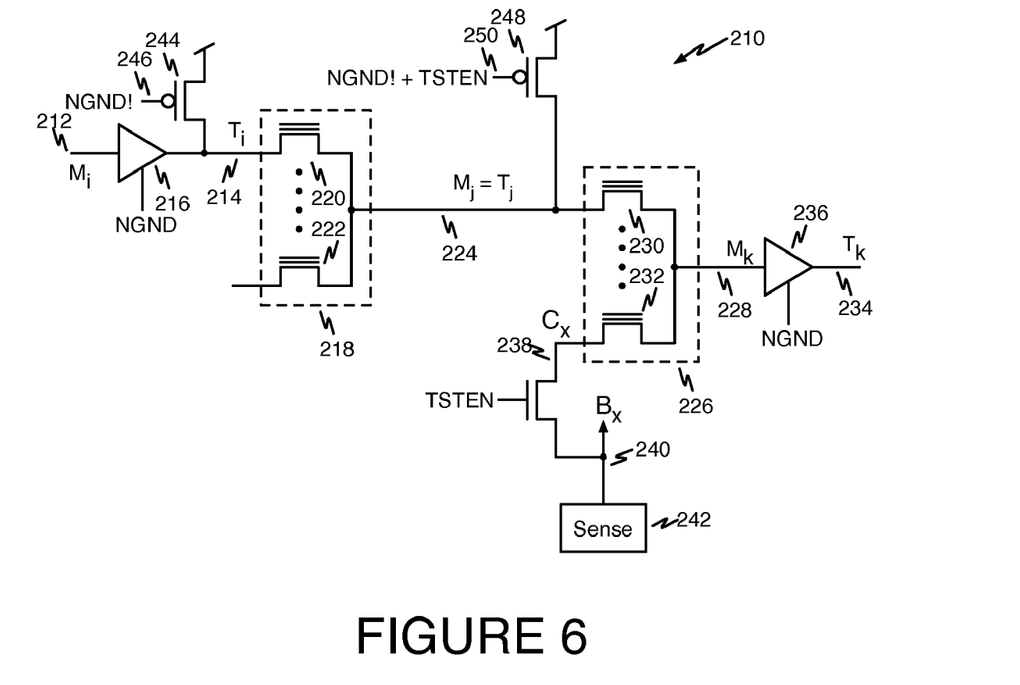
FIG. 6 is a diagram showing an illustrative circuit example where the output of one multiplexer is connected directly to a track without an intervening buffer.

It may be beneficial in some cases for multiplexers not to have a corresponding buffer. As will now be shown with reference to FIG. 6, another aspect of the present invention is shown. FIG. 6 shows a portion 210 of an FPGA architecture in accordance with an illustrative embodiment of this aspect of the present invention.

In FIG. 6, the output $M_i$ (at reference numeral 212 of one multiplexer (not shown) drives track $T_i$ at reference numeral 214 through buffer 216. The ground connection of buffer 216 is driven by the signal NGND as previously disclosed with reference to FIGS. 2 and 5. An input of multiplexer 218 (switch 220) is driven from track $T_i$. The output of multiplexer 218 $M_j$ (at reference numeral 224) is connected directly to a track $T_j$ without an intervening buffer. Track $T_j$ then fans out to other multiplexers, including multiplexer 226 at switch 230. The output $M_k$ of multiplexer 226 at reference numeral 228 drives track $T_k$ at reference numeral 234 through buffer 236. The ground connection of buffer 236 is driven by the signal NGND. The $C_x$ input to multiplexer 226 is shown connectable through transistor 238 to bitline $B_x$ at reference numeral 240. Bitline Bx may be sensed by sense amplifier 242.

Pullup transistor 244 can pull track $T_i$ up to $V_{DD}$ by asserting the signal NGND! on line 246. Similarly, pullup transistor 248 can pull track $T_i$ up to $V_{DD}$ when the signal (NGND!+TSTEN) on line 250 is low.

Unbuffered multiplexers do not require a tie off input. In the case of the circuit shown in FIG. 6, the test path must pass through two levels of multiplexers including multiplexers 218 and 226. If pullup transistors such as transistors 248 are provided on the outputs of the first-level multiplexers or inputs of the second-level multiplexers to drive them high during programming mode, these pullup transistors must not be activated during testing, only during programming.

The sense circuit 242 may use various methods to verify that the path under test is closed. The simplest would be for the sense circuit to sense current on the bitline $B_x$ at reference numeral 240.

An alternative method would be to use pre-charging and voltage sensing. First, the switches are turned off. Next, the bitline $B_x$ and the $C_x$ signal line are precharged to ground via the sense circuit. Next, the grounding circuit is disconnected, and then the switches are turned on. Next, that voltage on $B_x$ is verified as the sense circuit is gradually pulled up by pullup 244 through the path under test.

A potential difficulty with the voltage-sensing scheme is that charge sharing may prevent detection of an open in the track. Such a situation is shown in FIG. 7, to which attention is now drawn.

Figure 7:
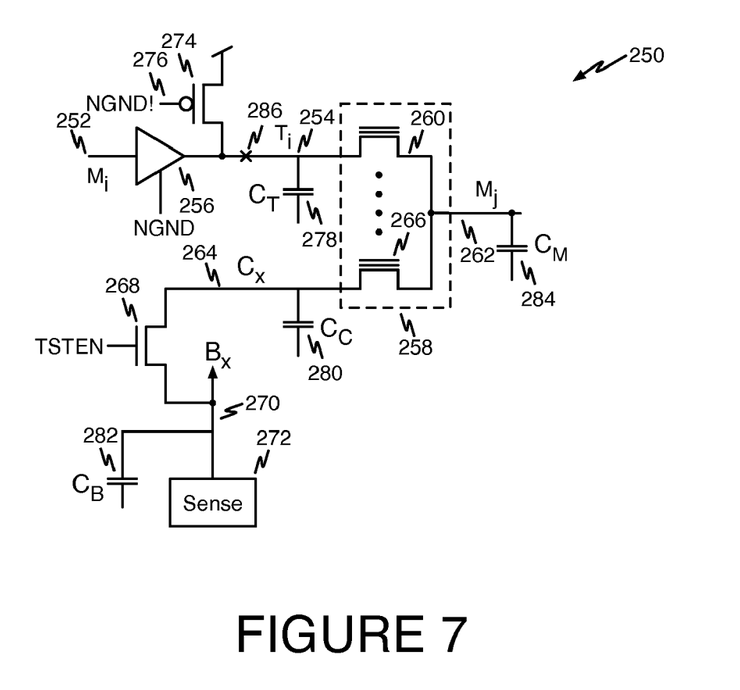
FIG. 7 is a diagram showing a potential difficulty wherein charge sharing may prevent detection of an open in the track using a voltage sensing scheme.

Referring now to FIG. 7, a portion 160 of an FPGA architecture is shown. The output $M_i$ at reference numeral 252 of a multiplexer (not shown) drives track $T_i$ at reference numeral 254 through buffer 256. The ground connection of buffer 256 is driven by the signal NGND. Track $T_i$ drives multiplexer 258 at its switch 260. The output $M_j$ of multiplexer 258 is shown at reference numeral 262.

Constant $C_x$ input to multiplexer 258 (at reference numeral 264) may be used to sense the output $M_j$ of multiplexer 258 through its $C_x$ input switch 266, through transistor 268 to bitline $B_x$ at reference numeral 270 using sense amplifier 272. The track Ti at reference numeral 254 may be pulled up by pullup transistor 274 by asserting the NGND! signal on line 276.

Track $T_i$ (reference numeral 254) has a capacitance $C_T$ shown at reference numeral 278. Input $C_x$ has a capacitance $C_C$ shown at reference numeral 280. Bitline $B_x$ has a capacitance $C_B$ shown at reference numeral 282. Multiplexer output $M_j$ (reference numeral 262) has a capacitance $C_M$ shown at reference numeral 284. There are some circumstances under which charge sharing may prevent detection of an open in the track, for example at reference numeral 286. However because the capacitances $C_B+C_C$ are large compared to $C_M+C_T$ this should not normally be an issue.

Figure 8:
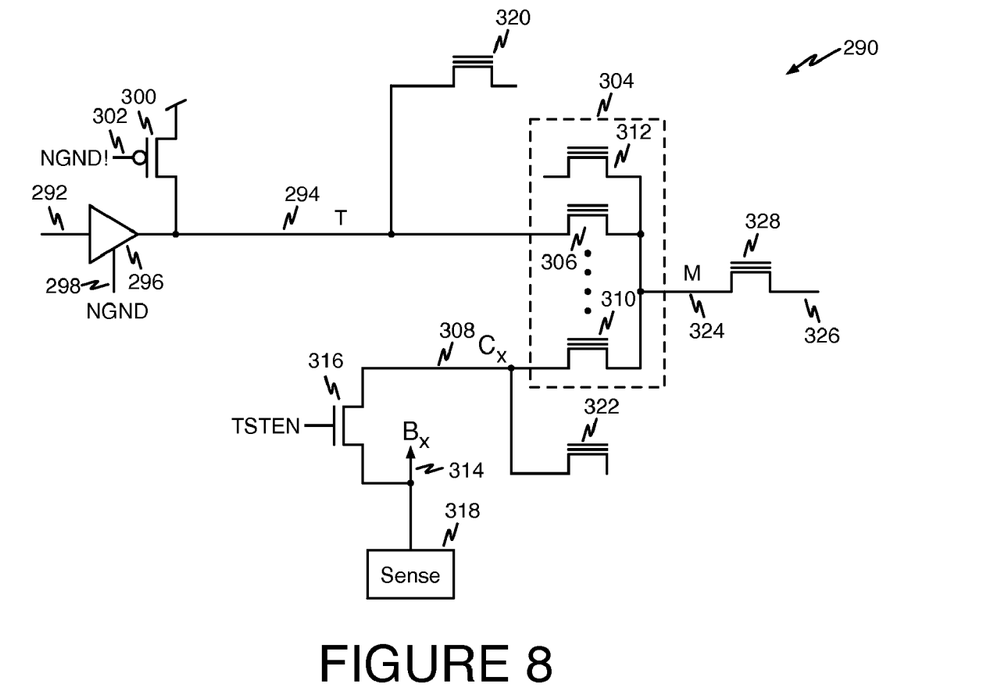
FIG. 8 is a diagram showing examples of switches that might cause parallel paths.

To ensure that a test does not fail to catch a fault, it must be ensured that other switches that might create a path parallel to the path under test are turned off during the test. Referring now to FIG. 8, examples of switches that might cause such parallel paths are shown.

In FIG. 8, a portion 290 of an FPGA includes an output 292 from a multiplexer (not shown) driving track T at reference numeral 294 through buffer 296. Buffer 296 is controlled by the NGND signal on line 298 as taught herein. Pullup transistor 300 can pull track 294 up to VDD when the NGND! signal is asserted on line 302.

Track T is connected to multiplexer 304 and drives one of its switches 306. Constant $C_x$ input line 308 drives switch 310 in multiplexer 304. Another switch 312 is shown in multiplexer 304. Constant line $C_x$ 308 may be sensed using transistor 316 to drive bitline $B_x$ at reference numeral 314 when the signal TSTEN at drives the gate of transistor 316. Sense amplifier 318 is coupled to bitline $B_x$.

Another switch 320 is shown coupled to track T and another switch 322 is shown coupled to constant line Cx. The output M of multiplexer 304 at reference numeral 324 is coupled to a track 326 through switch 328. Switches 320 and 322 may be associated with other multiplexers (not shown). The important thing is that none of these switches create another parallel path to track T; create another parallel path to the same bit line $B_x$ (or $C_x$, to which $B_x$ is connected during testing); or lead to another track T', which would create a parallel path to $V_{DD}$, bypassing portions of path under test. A path that violates one of these rules is called a sneak path.

Certain rules must be followed when arranging the connections to the switch array to make it possible to properly address the various combinations of switches required for testing.

Consider an input switch in row $y_1$ of a buffered multiplexer which connects a track T to the multiplexer output M at reference numeral 324 in FIG. 8. There must be some tie-off switch in column x and row $y_2$ connecting $C_x$ to M such that when $W_{y1}$ and $W_{y2}$ are turned on neither T nor M is connected to any other track T', nor is another parallel path created from T or M to T or $C_x$. (Note that $y_1$ and $y_2$ are not necessarily distinct).

Consider an input switch 220 in row $y_1$ of unbuffered multiplexer 218 in FIG. 6, which connects a track $T_i$ (at reference numeral 214) to the multiplexer output $M_j$ at reference numeral 224). Then there must be some input switch 230 in row $y_2$ of a buffered multiplexer 226 connecting the output $M_j$ of the unbuffered multiplexer to the buffered multiplexer output $M_k$ (at reference numeral 228), and a tie-off switch 232 of the buffered multiplexer in column x and row $y_3$ connecting $C_x$ (at reference numeral 238) to $M_k$, such that when $W_{y1}$ $W_{y2}$ and $W_{y3}$ are turned on and neither $T_i$, $M_j$ nor $M_k$ is connected to any other track T', nor is another parallel path created from $T_i$, $M_j$, or $M_k$ to $T_i$ or Cx. (Note that $y_1$, $y_2$ and $y_3$ are not necessarily distinct).

Figure 9:
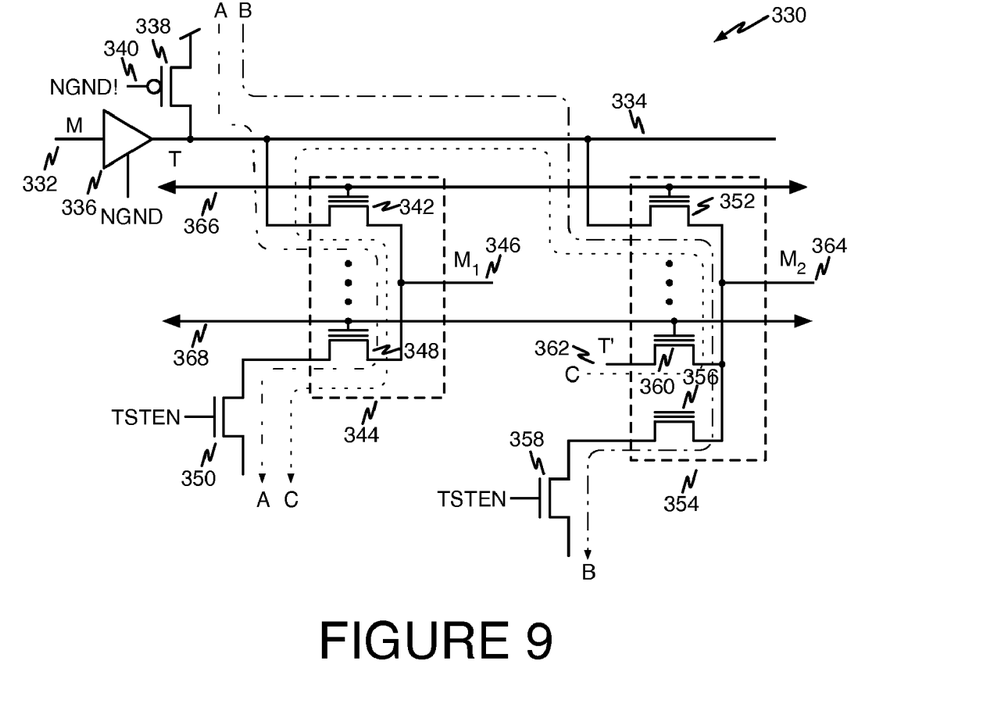
FIG. 9 is a diagram showing how a more detailed analysis may permit some relaxation of addressing rules without compromising fault coverage.

A more detailed analysis may permit some weakening of the above addressing rules without compromising fault coverage. FIG. 9 shows an example.

Referring now to FIG. 9, a portion 330 of an FPGA includes a multiplexer output M at reference numeral 332 driving track T at reference numeral 334 through buffer 336. Pullup transistor 338 can pull track T up to $V_{DD}$ when the signal NGND! is asserted on its gate at line 340.

Track T drives switch 342 in multiplexer 344. The output $M_1$ of multiplexer 344 is at line 346. Another switch 348 is coupled to transistor 350 controlled by the signal TSTEN. Track T also drives switch 352 in multiplexer 354. Another switch 356 is coupled to transistor 358 controlled by the signal TSTEN. Another switch 360 in multiplexer 354 is coupled to track T' at reference numeral 362. The output $M_2$ of multiplexer 354 is on line 364.

In this case, it is not possible to test the switch 342 connecting track T to multiplexer 344 without creating a sneak path to another track T' in multiplexer 354. To perform the test, word lines 366 and 368 are driven high, and transistors 338, 350, and 358 are turned on. Dashed line AA shows the intended test path from pullup transistor 338, through switch 342 in multiplexer 344, then through switch 348 and transistor 350. Dashed line CC shows the sneak path from T' through switches 360, 352, 342, 348 and transistor 350. This arises because word lines 366 and 368 turn on switches 342 and 348 as intended, but also turn on switches 352 and 360. Due to sneak path CC, the intended test path may miss certain faults, such as an open between pullup 338 and the point where track T splits on its way to switches 342 and 352. Dashed line BB shows a different test path, this one from pullup 338 through switches 352 and 356 to transistor 358 As can be seen from an examination of FIG. 9, any faults hidden by sneak path CC will be covered by the additional test path BB, so this type of sneak path may be tolerated provided the additional test path BB can itself be tested without additional sneak paths.

The procedures for each test are now described in detail, showing how to cover faults of types 8-13 (those that would otherwise require programming a large number of configurations to cover).

Figure 10:
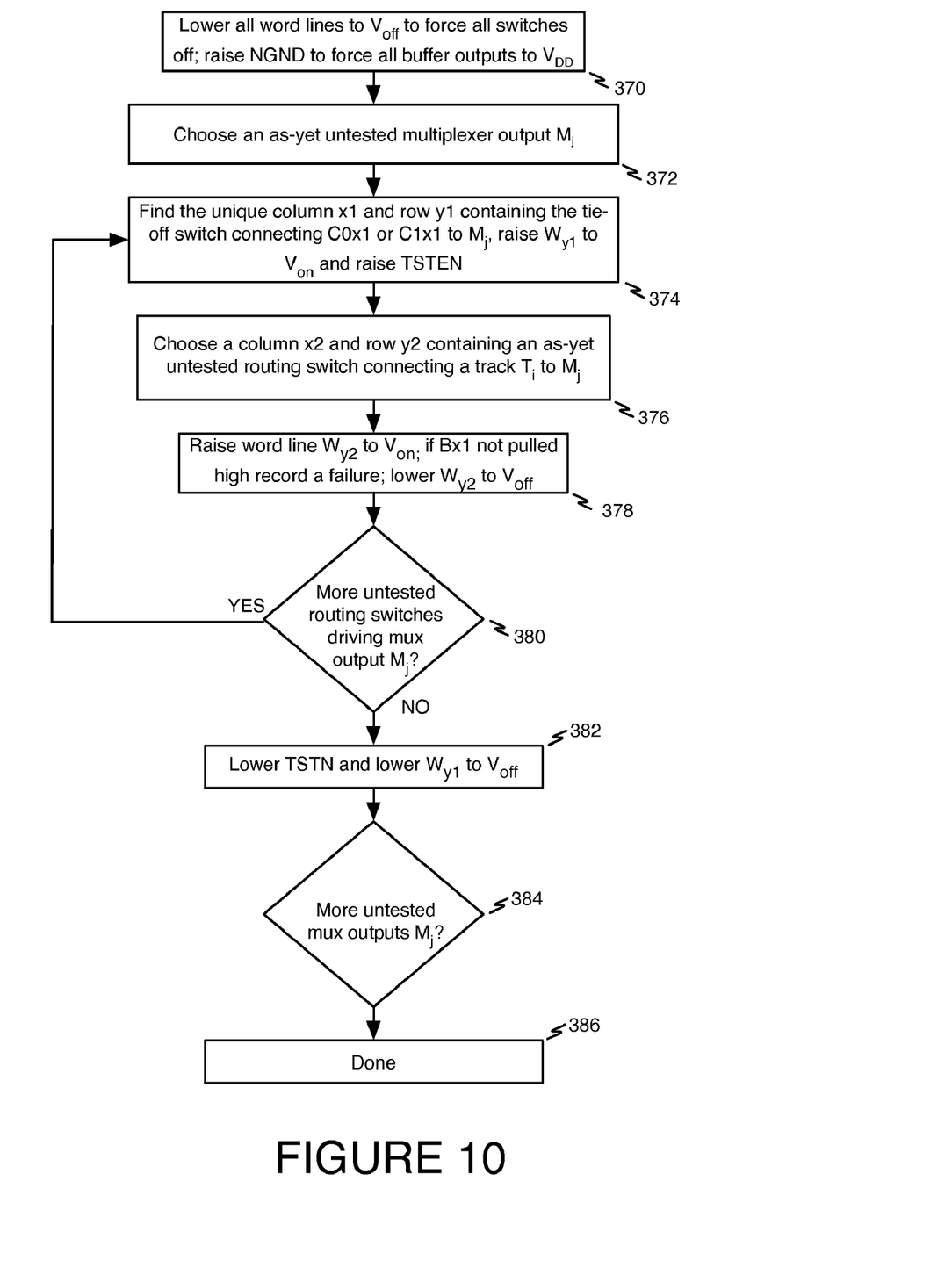
FIG. 10 is a flow diagram showing an illustrative test according to one aspect of the invention.

Referring now to FIG. 10, a flow diagram shows an illustrative method that may be used to test for switches that are stuck open (type 9 fault) or tracks that are open (type 10 fault). First, at reference numeral 370, all switches are forced off by lowering all word lines to $V_{off}$ and NGND is raised to force all buffer outputs to $V_{DD}$. Next at reference numeral 372 an as-yet untested multiplexer output $M_j$ is selected Next, at reference numeral 374, the unique column $x_1$ and row $y_1$ containing the tie-off switch connecting $C_{0x1}$ or $C_{1x1}$ to $M_j$ is found. Word line $W_{y1}$ is raised to $V_{on}$ and TSTEN is raised. Next, at reference numeral 376, a column x2 and row y2 containing an as yet untested routing switch connecting a track $T_i$ to $M_j$ is selected. Next, at reference numeral 378, word line $W_{y2}$ is raised to $V_{on}$. The observation circuit is used to verify that bit line $B_{x1}$ is pulled high (by the path from $V_{DD}$ through $T_i$, the switch in column x2 and row y2, $M_j$, and the switch in column x1 and row y1). If this was not the case, record a failure. Then the voltage on word line $W_{y2}$ is lowered back to $V_{off}$. Next, at reference numeral 380, a check is made to determine whether there are more untested routing switches driving multiplexer output $M_j$. If so, the process returns to reference numeral 376. If not, at reference numeral 382, TSTEN is lowered and $W_{y1}$ is lowered back to $V_{off}$. Next, at reference numeral 384 a check is made to determine whether there are more untested multiplexer outputs $M_j$. If so, the process returns to reference numeral 372. If not, this test is completed.

It is apparent that in some cases raising $W_{y2}$ to $V_{on}$ can be performed for more than one multiplexer simultaneously to reduce test time. Let S be the set of multiplexers for which raising $W_{y2}$ to $V_{on}$ is being done simultaneously. Let i be a multiplexer in the set S. Let $x_1[i]$ be the value of $x_1$ for multiplexer i, etc. Then for every pair of multiplexers i and j in S, all of the following conditions must be true:

(1) $x_1[i] \ne x_1[j]$
(2) multiplexer i has switches in only two rows from the set $\{y_1[i], y_2[i], y_1[j], y_2[j]\}$
(3) multiplexer j has switches in only two rows from the set $\{y_1[i], y_2[i], y_1[i], y_2[j]\}$.

Figure 11:
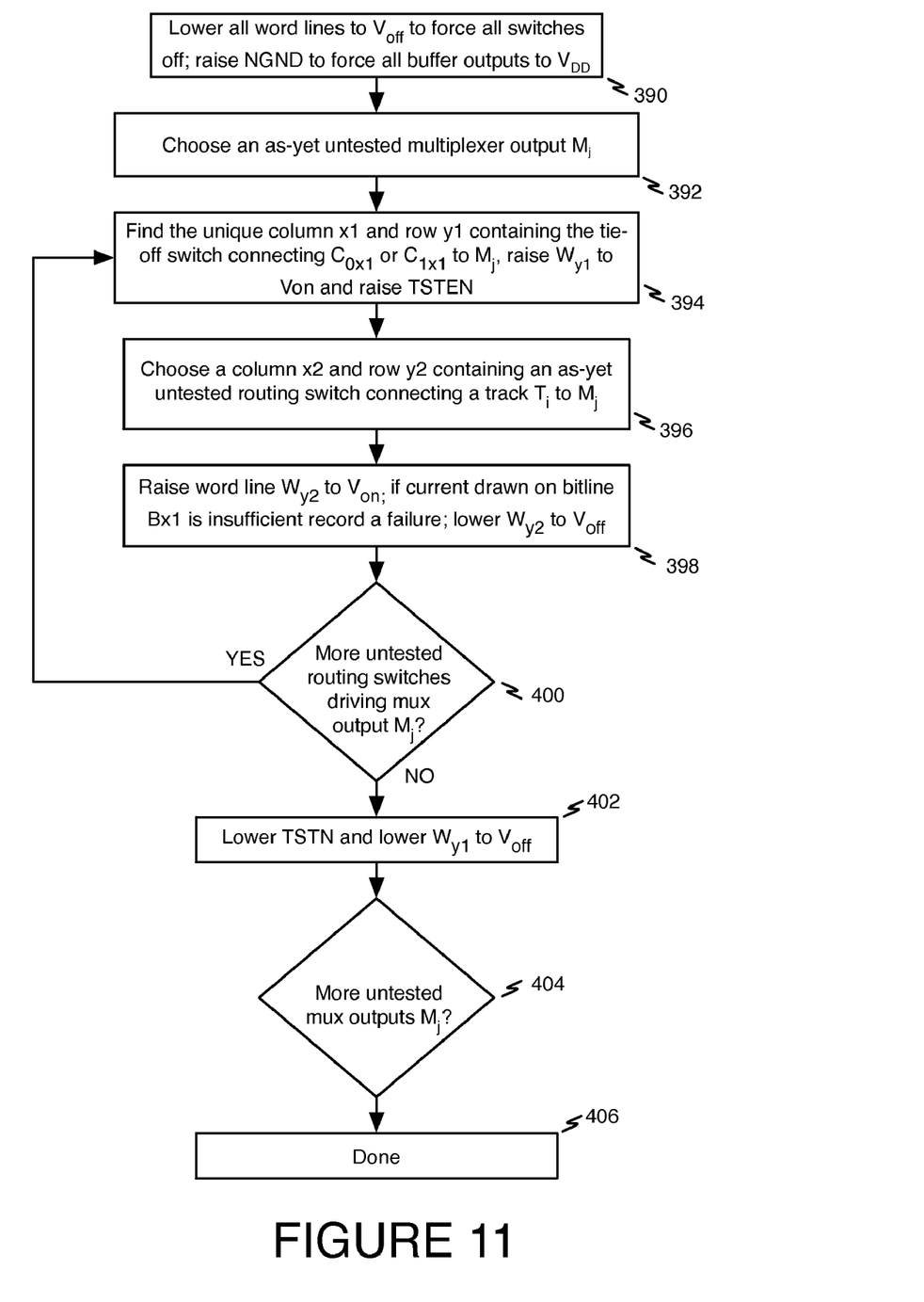
FIG. 11 is a flow diagram showing an illustrative test according to another aspect of the invention.

Referring now to FIG. 11, a flow diagram shows an illustrative method that may be used to test for resistive switches or tracks (type 12 or 13 faults). The same procedure as was used for testing stuck open faults is used, except that at step 398 the observation circuit must detect whether the current required to ground $B_x$ is sufficiently high.

Suppose each of the two switches in the pull-up path has a resistance of 5K ohms, and the device gated by TSTEN also has a resistance of 5K ohms for a total of 15K ohms. A defective contact or resistive switch is likely to add 20K ohms, roughly doubling the total resistance of the path. In this case a sufficiently high current to pass the test would be at least one half the typical (non-defective) current.

Figure 12:
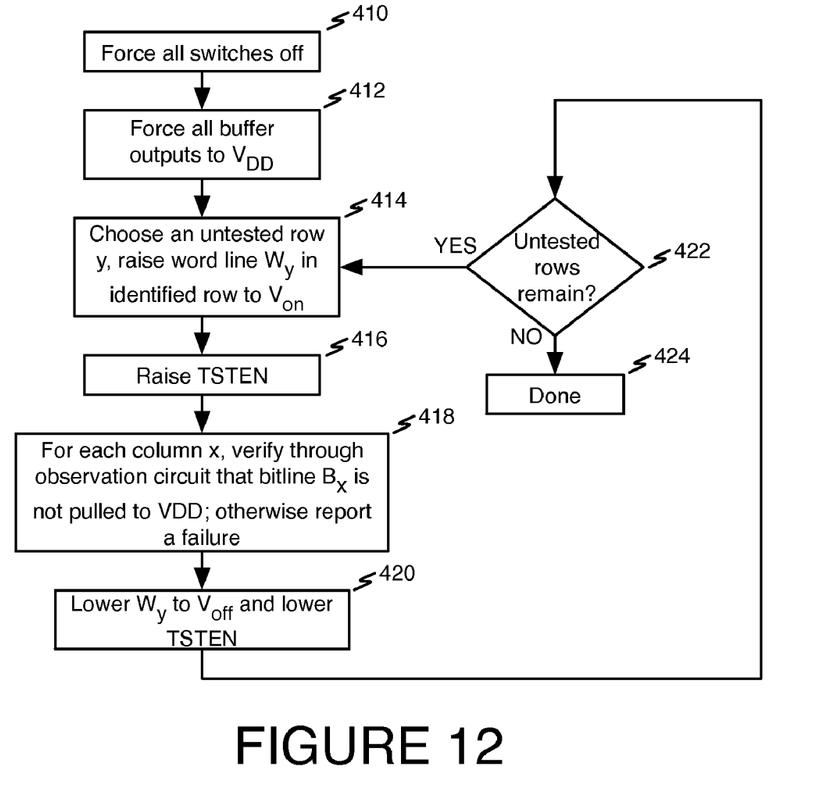
FIG. 12 is a flow diagram showing an illustrative test according to another aspect of the invention.

Referring now to FIG. 12, a flow diagram shows an illustrative method that may be used to test for switches that are stuck closed (type 4 or 8 faults), or any other shorts between a routing track and a non-corresponding buffer input (type 7 fault). First, at reference numeral 410, all switches are forced off by lowering all word lines to $V_{off}$. Then, at reference numeral 412, NGND is raised to all buffer outputs to $V_{DD}$. An as yet untested row y is selected, and $W_y$ is raised to $V_{on}$ at reference numeral 414. TSTEN is raised at reference numeral 416. For each column x, the observation circuit on bit line $B_x$ is used at reference numeral 418 to verify that $B_x$ is not being pulled to $V_{DD}$ (through the switch in column x and row y and any other switch that is stuck-on in the same multiplexer as this switch). If $B_x$ is being pulled to $V_{DD}$, a failure is recorded. Next, at reference numeral 420, TSTEN is then lowered and $W_y$ is lowered back to $V_{off}$. Next, at reference numeral 422, it is determined whether any untested rows y remain. If so, the process returns to reference numeral 414. Otherwise this test is done at reference numeral 424.

Persons of ordinary skill in the art will note that instead of turning on each individual row in turn, it may be possible in some cases to turn on two or more rows simultaneously provided this does not create a path from any track $T_i$ to any bit line $B_x$ (in the absence of stuck-closed switches).

To test for an open connection to the tie-off switches (type 11 fault), it needs to be verified that the input of each tie-off switch is properly connected to its constant in normal mode. The above-disclosed tests illustrated with reference to FIGS. 10-12 have verified continuity from each tie-off switch input to the corresponding $C_{0x}$ or $C_{1x}$ and bit line $B_x$. It remains to verify that $C_{0x}$ and $C_{1x}$ are properly driven to logic 0 or logic 1, respectively, in normal mode.

Figure 13:
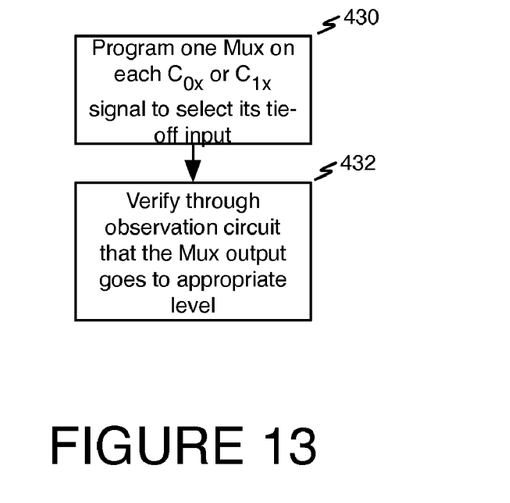
FIG. 13 is a flow diagram showing an illustrative test according to another aspect of the invention.

One way to do this is to program an appropriate set of test configurations and execute appropriate tests on each. It suffices to program one multiplexer on each $C_{0x}$ or $C_{1x}$ signal to select its tie-off input and observe that the multiplexer output goes to the appropriate level. (Only one is necessary because the input switch testing verifies continuity from each tie-off switch to the bit line $B_x$.) This should require only one or two configurations. An exemplary one of such tests is illustrated with reference to FIG. 13. First, at reference numeral 430, one multiplexer on each $C_{0x}$ or $C_{1x}$ signal is programmed to select its tie-off input. Then, at reference numeral 432, it is verified through the observation circuit that the output of the multiplexer is at the level of the selected $C_{0x}$ or $C_{1x}$ signal.

It is also possible to use the bit lines to verify that each $C_{1x}$ is pulled high. This requires activating both transistors connected to $C_{1x}$ in FIG. 3A, which would require provision of another independent control signal instead of TSTEN on gate line 76.

The present invention involves adding new devices gated by TSTEN or TSTEN!, as shown in FIGS. 3A through 3C. Stuck open or closed faults in these new devices are also covered, as will now be disclosed.

For devices connecting $C_{0x}$ to NGND or $C_{1x}$ to $V_{DD}$, stuck open test is already covered as a fault of type 11. A stuck closed test is already covered by switch stuck closed test above $B_x$ pulled up when it should not be).

For devices connecting $C_{0x}$ or $C_{1x}$ to $B_x$, a stuck open test is already covered by the switch-stuck-open test above $B_x$ not pulled up when it should be). A stuck closed test comprises turning TSTEN off, NGND high, all $W_y$ lines on, and making sure no $B_x$ line is pulled high.

During normal operation, $C_0$ is tied to logic 0 and $C_1$ to logic 1. However there may be some tests during which it is convenient to temporarily switch $C_0$ to logic 1, or $C_1$ to logic 0, or both.

Instead of providing separate $C_x$ and $B_x$ lines for every column of switches, it may be possible to save circuitry by having one pair of $C_x$ and $B_x$ lines shared by multiple switch columns. However this may complicate the task of satisfying the rules for arranging the switches in the array and limit the number of paths that may be tested simultaneously.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an FPGA architecture containing a routing multiplexer having an output and a plurality of inputs including a tie-off input that is coupled to a constant during normal operation, a method for testing the routing multiplexer comprising:
   coupling one input of the routing multiplexer other than the tie-off input to the output of the routing multiplexer;
   placing a signal on the one input of the routing multiplexer;
   coupling the tie-off input to the output of the routing multiplexer; and
   coupling the tie-off input of the routing multiplexer to a sensing circuit to observe the output of the routing multiplexer.

2. In an FPGA architecture containing a routing multiplexer having an output and a plurality of inputs including a tie-off input that is coupled to a constant during normal operation, a method for testing the routing multiplexer comprising:
   coupling the tie-off input to the output of the routing multiplexer;
   placing a test signal on an input of the routing multiplexer other than the tie-off input of the routing multiplexer; and
   coupling the output of the routing multiplexer to a sensing circuit to observe the output of the routing multiplexer.

3. In an FPGA architecture including multiplexers formed from non-volatile switches having control gates coupled to word lines, each word line associated with a row, the multiplexers having outputs coupled to wiring tracks through buffers having controllable ground connections, a first plurality of the non-volatile switches being routing switches coupling signals into the multiplexer from routing tracks, and a second plurality of the non-volatile switches being tie-off switches coupleable to one of a plurality of bit lines and coupled to a constant during normal operation, each bit line associated with a column, a method of testing for routing switches that are stuck open or tracks that are open comprising:
   forcing all non-volatile switches to an off state;
   asserting a test enable signal to force all buffer outputs to a logic high level;
   selecting a multiplexer having a tie-off switch;
   asserting a turn-on voltage for the tie-off switch onto a word line for the row containing the tie-off switch;
   coupling the tie-off switch to a bit line bit line for a column containing the tie-off switch;
   individually for each routing switch in the multiplexer:
      turning on the routing switch and sensing the bit line associated with the tie-off switch; and
      determining that the routing switch is stuck open or the routing track from which it receives a signal is open if the bit line associated with the tie-off switch is not pulled high.

4. The method of claim 3 further including de-asserting the test enable signal, turning off the routing switch, and turning off the tie-off switch.

5. The method of claim 3 wherein selecting a multiplexer having a tie-off switch, asserting a turn-on voltage for the tie-off switch onto a word line for the row containing the tie-off switch, coupling the tie-off switch to a bit line bit line for a column containing the tie-off switch, individually for each routing switch in the multiplexer, turning on the routing switch and sensing the bit line associated with the tie-off switch; and determining that the routing switch is stuck open or the routing track from which it receives a signal is open if the bit line associated with the tie-off switch is not pulled high are performed for each multiplexer having a tie-off switch.

6. The method of claim 3 wherein more than one multiplexer having a tie-off switch is simultaneously selected; and
turning on the routing switch is performed for more than one multiplexer simultaneously.

7. In an FPGA architecture including multiplexers formed from non-volatile switches having control gates coupled to word lines, each word line associated with a row, the multiplexers having outputs coupled to wiring tracks through buffers having controllable ground connections, a first plurality of the non-volatile switches being routing switches coupling signals into the multiplexer from routing tracks, and a second plurality of the non-volatile switches being tie-off switches coupleable to one of a plurality of bit lines and coupled to a constant during normal operation, each bit line associated with a column, a method of testing for resistive switches or tracks comprising:
forcing all non-volatile switches to an off state;
asserting a test enable signal to force all buffer outputs to a logic high level;
selecting a multiplexer having a tie-off switch;
asserting a turn-on voltage for the tie-off switch onto a word line for the row containing the tie-off switch;
coupling the tie-off switch to a bit line bit line for a column containing the tie-off switch;
individually for each routing switch in the multiplexer:
turning on the routing switch; and
determining that the routing switch is resistive or the routing track from which it receives a signal is resistive if a current required to force the bit line associated with the tie-off switch to ground is above a selected current threshold.

8. The method of claim 7 wherein the selected current threshold is at least one half a typical current where there is no resistive defect.

9. The method of claim 7 wherein more than one multiplexer having a tie-off switch is simultaneously selected; and turning on the routing switch is performed for more than one multiplexer simultaneously.

10. In an FPGA architecture including multiplexers formed from non-volatile switches having control gates coupled to word lines, each word line associated with a row, the multiplexers having outputs coupled to wiring tracks through buffers having controllable ground connections, a first plurality of the non-volatile switches being routing switches coupling signals into the multiplexer from routing tracks, and a second plurality of the non-volatile switches being tie-off switches coupleable to one of a plurality of bit lines and coupled to a constant during normal operation, each bit line associated with a column, a method of testing for routing switches that are stuck closed or any other shorts between a routing track and a non-corresponding buffer input comprising:
forcing all non-volatile switches to an off state;
asserting a test enable signal to force all buffer outputs to a logic high level;
selecting a multiplexer having a tie-off switch;
asserting a turn-on voltage for a tie-off switch in the selected multiplexer onto a word line for the row containing the tie-off switch;
sensing the voltage on the bit line of the column associated with the tie-off switch; and
determining that a routing switch in the selected multiplexer is stuck closed or any short circuits exist between a routing track and a non-corresponding buffer input associated with the selected multiplexer if the bit line of the column associated with the tie-off switch is pulled to a high logic level.

11. The method of claim 10 further including de-asserting the test enable signal, turning off the tie-off switch.

12. The method of claim 10 wherein at least two rows are turned on simultaneously provided that turning on at least two rows does not create a path from any track $T_i$ to any bit line $B_x$ in the absence of stuck-closed switches.

* * * * *